United States Patent
Miner et al.

(10) Patent No.: US 10,388,846 B2
(45) Date of Patent: Aug. 20, 2019

(54) FORMATION OF A DENSIFIED OBJECT FROM POWDERED PRECURSOR MATERIALS

(71) Applicant: Matrix Industries, Inc., Menlo Park, CA (US)

(72) Inventors: Andrew C. Miner, San Francisco, CA (US); Kathryn E. Alexander, Burlingame, CA (US)

(73) Assignee: MATRIX INDUSTRIES, INC., Menlo Park, CA (US)

( * ) Notice: Subject to any disclaimer, the term of this patent is extended or adjusted under 35 U.S.C. 154(b) by 126 days.

(21) Appl. No.: 14/671,932

(22) Filed: Mar. 27, 2015

(65) Prior Publication Data

US 2016/0380175 A1  Dec. 29, 2016

Related U.S. Application Data

(60) Provisional application No. 61/967,864, filed on Mar. 28, 2014.

(51) Int. Cl.
*B22F 3/12* (2006.01)
*B22F 3/14* (2006.01)
(Continued)

(52) U.S. Cl.
CPC ............. *H01L 35/34* (2013.01); *B22F 3/14* (2013.01); *C22C 1/0491* (2013.01); *H01L 31/18* (2013.01);
(Continued)

(58) Field of Classification Search
CPC ......... H01L 35/34; H01L 35/18; H01L 35/20; H01L 31/18; H01L 35/32; H01L 35/04;
(Continued)

(56) References Cited

U.S. PATENT DOCUMENTS

| 4,588,520 A * | 5/1986 | Jayadev | H01L 35/34 252/512 |
| 6,274,802 B1 * | 8/2001 | Fukuda | H01L 35/34 136/201 |

(Continued)

FOREIGN PATENT DOCUMENTS

EP  2361887 A1  9/2011

OTHER PUBLICATIONS

German, Randall M., *Liquid Phase Sintering*, 1985, pp. 1-11, Plenum Press, New York, NY USA.
(Continued)

*Primary Examiner* — Mohsen Ahmadi
*Assistant Examiner* — Scott E Bauman
(74) *Attorney, Agent, or Firm* — Wilson Sonsini Goodrich & Rosati

(57) ABSTRACT

A method for forming a densified solid object corresponding to a thermoelectric element from a mixture of uncompressed, powdered constituent materials. A powdered precursor material may be selected to cause a shrinkage of at least twenty percent in at least two mutually orthogonal linear dimensions of a densified solid object compared to corresponding dimensions of a mold cavity. In some embodiments, a precursor material is selected to produce a thermoelectric material having electrical and mechanical properties suitable for a thermoelectric module. In some embodiments, at least two thermoelectric elements are electrically connected to conductive plates to form a thermoelectric module.

18 Claims, 6 Drawing Sheets

Section B-B

(51) Int. Cl.
*B22F 9/04* (2006.01)
*C22C 1/04* (2006.01)
*H01L 31/18* (2006.01)
*H01L 35/18* (2006.01)
*H01L 35/20* (2006.01)
*H01L 35/34* (2006.01)

(52) U.S. Cl.
CPC .............. *H01L 35/18* (2013.01); *H01L 35/20* (2013.01); *B22F 9/04* (2013.01); *B22F 2009/043* (2013.01); *B22F 2998/10* (2013.01)

(58) Field of Classification Search
CPC ........ B22F 3/14; B22F 9/04; B22F 2009/043; B22F 2998/10; C22C 1/0491
USPC .......................................................... 438/54
See application file for complete search history.

(56) References Cited

U.S. PATENT DOCUMENTS

| | | | |
|---|---|---|---|
| 6,436,580 B1 | 8/2002 | Sugikawa | |
| 6,710,238 B1* | 3/2004 | Shingu | H01L 23/24 136/201 |
| 8,591,758 B2* | 11/2013 | Fleurial | B22F 9/04 136/239 |
| 8,865,995 B2* | 10/2014 | Ren | H01L 35/16 136/201 |
| 2003/0110892 A1* | 6/2003 | Nicoloau | C04B 35/58085 75/594 |
| 2008/0173344 A1* | 7/2008 | Zhang | H01L 35/16 136/238 |
| 2010/0051081 A1* | 3/2010 | Iida | B09B 3/005 136/240 |
| 2011/0304004 A1* | 12/2011 | Park | H01L 35/16 257/467 |
| 2013/0298729 A1* | 11/2013 | Lee | H01L 35/18 75/230 |
| 2015/0247655 A1* | 9/2015 | Shin | H01L 35/08 136/203 |

OTHER PUBLICATIONS

Seong Jin Park et al., "Finite Element Simulation of Liquid Phase Sintering with Tungsten Heavy Alloys", Materials Transactions, 226, pp. 2475-2752, vol. 47 No. 11.
Svoboda, J. et al., "A Model for Liquid Phase Sintering", Acta Mater, 1996, pp. 3215-3226, vol. 44 No. 8.
Maca, K. et al., "Sintering Densification Curve—A Practical Approach For Its Con-struction from Dilatometric Shrinkage Data", Sc. of Sintering, 2008, vol. 40 pp. 117-122.
Blaine, D.C. et al., "Sintering Shrinkage and Microstructure Evolution during Densification of a Martensitic Stainless Steel", Pennsylvania State University, 2003.
Author unknown, "Thermoelectrics" website pages from Internet address http://thermoelectrics.matsci.northwestern.edu/thermoelectrics/index.html, from Northwestern University Dept. of Materials Science and Engineering, original publication date unknown.

* cited by examiner

Section A-A

Section B-B

FORMATION OF A DENSIFIED OBJECT FROM POWDERED PRECURSOR MATERIALS

CROSS REFERENCE

This application claims priority to U.S. Provisional Patent Application No. 61/967,864, filed on Mar. 28, 2014, and is incorporated herein by reference in its entirety.

FIELD OF THE INVENTION

Embodiments are related in general to forming solid objects by heating uncompressed powdered precursor materials in a mold, and more specifically to forming thermoelectric elements from an uncompressed powdered mixture of precursor materials.

BACKGROUND

A thermoelectric element is a device capable of transforming a temperature difference into an electric voltage and vice versa. At least two thermoelectric elements may be thermally and electrically coupled to one another to form a thermoelectric module. A thermoelectric module may include two types of thermoelectric elements, for example a thermoelectric element composed of a P-type material and another thermoelectric element composed of an N-type material. The P-type material may have a Seebeck coefficient that is more positive than the Seebeck coefficient for the N-type material. The N-type material may have a Seebeck coefficient that is more negative than the Seebeck coefficient for the P-type material.

A thermoelectric module powered by an external electrical power source may operate as a heat pump, with thermal energy absorbed at one set of thermoelectric junctions and released at another set of thermoelectric junctions. Alternatively, a thermoelectric module receiving thermal energy from an external heat source at one set of thermoelectric junctions while having a lower temperature heat sink coupled to another set of thermoelectric junctions may generate electrical power available for coupling to an external electrical load.

A thermoelectric element is preferably formed from materials that efficiently transform an applied temperature differential into electrical energy, or conversely, electrical energy into a temperature differential, depending on the application and arrangement of elements in a thermoelectric module. Thermoelectric properties of a thermoelectric element may be described by any one or more of the Seebeck coefficient, thermal conductivity, and electrical resistivity. Preferred properties of a thermoelectric element include chemical and mechanical stability under intended operating conditions, mechanical strength, for example compression strength, and the ability to form low-loss electrical and thermal connections with other thermoelectric elements and other parts of a thermoelectric module.

Previously known methods and equipment for transforming raw materials into commercially useful thermoelectric elements have been complex and expensive to build and operate. For example, in the zone melting method, a common previously known method for volume production, a protective coating of graphite is applied to an ampule made of quartz or similar glass. The ampule is then arranged vertically, precursor materials for the thermoelectric element are loaded into the ampule, and a seed crystal may be placed in the bottom of the ampule, where melting will begin when the ampule is heated by movable heating elements. The movable heating elements may be arranged in a ring capable of travelling along the length of the ampule, for example from the bottom towards the top of the ampule. As the heater moves along the ampule, material in the ampule melts in a zone near the heater. Melted material cools as it emerges from the melted region and crystallizes into a solid having a higher density than the mixture of constituent precursor materials loaded into the ampule. The crystallized material is then removed from the ampule as an ingot and remnant graphite removed from the ingot.

After removal from the ampule, the ingot is cut into slices and the slices cut into individual thermoelectric elements. The thermoelectric elements may need additional shaping or polishing, for example to remove saw marks, before the thermoelectric elements are assembled into a thermoelectric module. Some of the material from the ingot is lost during cutting and any subsequent shaping and polishing operations needed to produce thermoelectric elements having preferred finished dimensions. Other material from the ingot may be lost because pieces removed near the sides or ends of the ingot may not have a shape suitable for use in a thermoelectric module.

Another previously known processing method for forming thermoelectric elements includes subjecting a mixture of powders to compression at elevated temperatures to form an ingot from which the thermoelectric elements are cut. For example, in US Patent application 2010/0051081 by Iida et al., magnesium and silicon raw materials are melted in an alumina crucible for three hours at 1100° C. in a reducing atmosphere of 5% hydrogen, then pulverized to a powder having particles small enough to pass through a 30 micrometer mesh. The powder is compressed in a spark plasma sintering system under 17 to 30 Mpa of pressure at 800 C, holding for 10 minutes. The resulting ingot may then be sawed into individual thermoelectric elements. Electrically conductive plates may be joined to the solid object resulting from processing of the powder, before or after slices from the ingot are sectioned. The conductive plates provide a path for heat energy and electrical energy to flow through the thermoelectric element. The long, high temperature melting step, as well as the complex, serial nature of a spark plasma sintering press operation result in a complex material formation process.

Various methods have been applied to the formation of solid objects from components in powder form. For example, in metal injection molding, powdered metal, possibly mixed with a binder to form a feedstock material with desired flow properties, is injected into a mold at relatively high pressure. The molded part is removed from the mold and then heated to drive off any binders and cause bonding between the metal particles in the molded part. Shrinkage of about five percent may occur when comparing a finished part to mold dimensions.

Powdered metallurgy is a family of processes used to form a solid object from component powdered materials. Powdered materials are compressed to form an intermediate, high-porosity solid referred to as a green body or a green compact. The green compact is subjected to heat treatment to cause bonding between the particles in the mixture of powdered constituents, leading to a reduction in porosity and densification of the solid object. When heat treatment is conducted without bringing the material to melting or the point of liquefaction, this process may be referred to as sintering. The maximum temperature during heating of the green compact may be less than the melting point temperature of at least one of the constituents of the mixed powder.

The formation of a green compact or green body is common to several previously known methods for densifying powdered materials. During sintering, a green body may increase in size or decrease in size depending on the combination of constituent powders, processing temperatures, and other factors. Some sintering processes are known to cause shrinkage of a green body. For example, a green body including ceramic materials or metals such as titanium may be expected to shrink up to about 20 percent when subjected to some previously known sintering processes.

Other processes such as hot pressing and powder metallurgy may be used to form a solid object from powdered constituents. These processes apply compression forces to a powder heated to form a solid object. Compression may be achieved by compression forces acting from outside the powdered mixture, for example by tamping with a plunger or similar mechanical compression device or by subjecting the powder to high pressure in a closed vessel.

SUMMARY

An example of a method embodiment includes selecting a powdered solid precursor material for forming a thermoelectric alloy and forming the thermoelectric element comprising the thermoelectric alloy from the precursor material. Forming the thermoelectric element further includes introducing the precursor material into a cavity in a mold, heating the precursor material to a temperature that is less than a melting point temperature of the thermoelectric alloy to be formed from the precursor material, and heating the precursor material in the mold until the precursor material forms the thermoelectric element from the thermoelectric alloy.

The precursor material may optionally be selected to cause a reduction of at least twenty percent (20%) for at least two mutually orthogonal linear dimensions of the thermoelectric element compared to corresponding linear dimensions of the cavity in the mold.

The precursor material may optionally be selected to cause a reduction of at least thirty percent (30%) for at least two mutually orthogonal linear dimensions of the thermoelectric element compared to corresponding linear dimensions of the cavity in the mold.

The precursor material may optionally be selected to cause a reduction of at least forty percent (40%) for at least two mutually orthogonal linear dimensions of the thermoelectric element compared to corresponding linear dimensions of the cavity in the mold.

The precursor material is preferably introduced into the mold as an uncompacted powder. In some embodiments, the precursor material is heated in the presence of at least one of argon, xenon, and hydrogen.

An embodiment may optionally combine at least two thermoelectric elements in an electric circuit to form a thermoelectric module.

DESCRIPTION

An embodiment comprises a method for forming a thermoelectric element from a mixture of uncompressed, powdered constituent materials placed in a mold and heated to form a densified solid object having electrical and thermal properties advantageous for use in a thermoelectric module. Embodiments are effective for consolidating loose powders or granules into dense solid objects, with less wasted raw material, less energy consumed, lower equipment costs, and lower labor costs compared to previously known methods. Embodiments may be used for efficient high-volume production of separate thermoelectric elements, without losing material to saw cuts or other bulk material removal processes used by previously known methods for separating an ingot of bulk thermoelectric material into separate thermoelectric devices.

Embodiments form densified solid objects without a green compact having been formed as a beginning or intermediate step. Furthermore, some embodiments produce a densified solid object with a magnitude of shrinkage of at least twenty percent in linear dimensions along all three orthogonal spatial directions compared to corresponding linear dimensions of a cavity in a mold. An embodiment produces a magnitude of shrinkage of at least twenty percent along at least two orthogonal spatial directions when the densified solid object is restrained from shrinking in one spatial direction, for example by having been bonded to another structure during formation of the object (ref. discussion relating to FIGS. 9-10). This is an unexpectedly large degree of shrinkage for a process that does not apply a compaction or compression step to loose powder in a mold, not predictable from results achieved by previously known methods for densifying mixtures of powders to form thermoelectric elements. By way of comparison, prior art methods which melt a powder in a mold may achieve a substantial shrinkage in only one spatial direction (e.g. spatial direction corresponding to the depth of the mold cavity) when the solid powder melts and conforms by fluid flow to the linear dimensions of the mold in the other two spatial directions (e.g. spatial directions corresponding to length and width).

Figure 1:
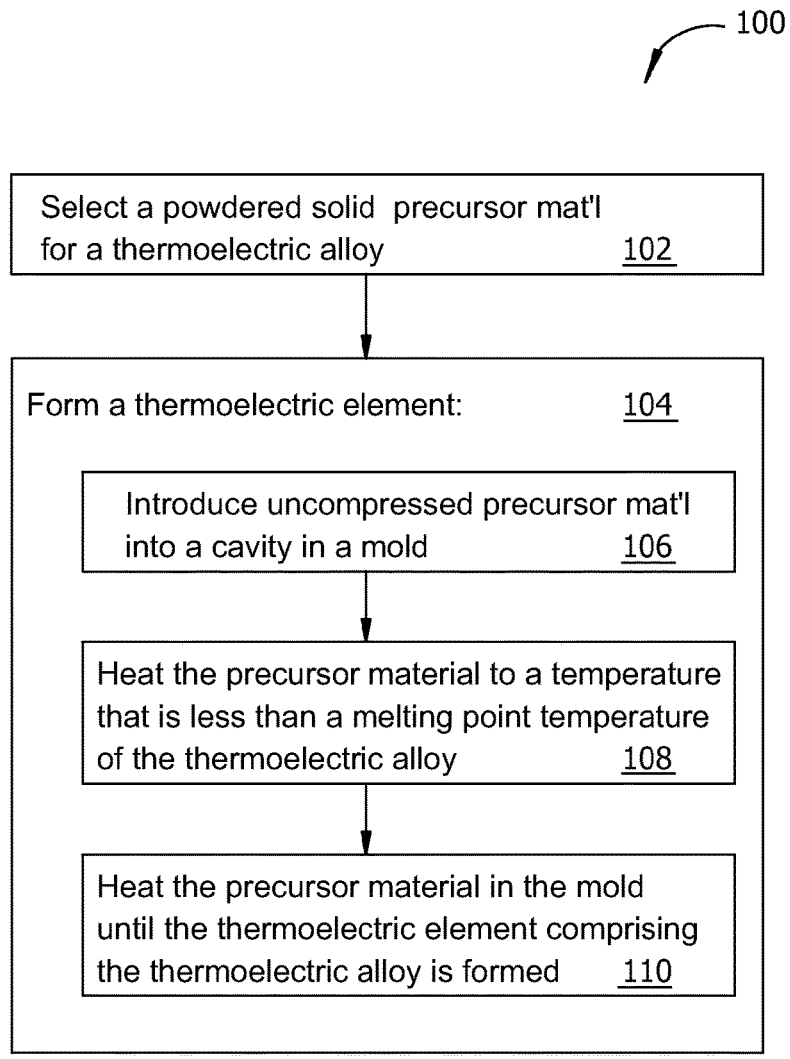
FIG. 1 illustrates an example of a method embodiment.

An example of a method for making a thermoelectric element in accord with an embodiment is shown in FIG. 1. The example of a method embodiment 100 includes in step 102 selecting a powdered solid precursor material for a thermoelectric alloy capable of forming a thermoelectric element having electrical, thermal, and possibly other properties suitable for making a thermoelectric module. A precursor material may be selected to produce a thermoelectric element having a value of Seebeck coefficient in a preferred range, a value of generated voltage in a preferred range, a minimum temperature differential needed to produce a preferred output voltage, a preferred mechanical property such as compression strength or dimensional stability, a lack of chemical reactivity when exposed to a specified element or compound, or other parameters relating to a thermoelectric element or a thermoelectric module. For example, a thermoelectric alloy made from a preferred precursor material may have a Seebeck coefficient with an absolute value greater than twenty microvolts per kelvin (>20 µV/K). Optionally, a thermoelectric alloy made from a preferred precursor material may have a value of thermal conductivity that is less than ten watts per meter-kelvin (<10 W/m-K). As another example, a thermoelectric alloy made from a preferred precursor material may have a value of electrical resistivity that is less than 200 microOhm-meter (<200 µΩ-m).

The example of FIG. 1 continues with forming the thermoelectric element in step 104. Forming the thermoelectric element includes introducing the precursor material into a cavity in a mold in step 106. The precursor material is preferably placed in the mold in a loose, uncompacted condition. A method embodiment preferably proceeds to completion of a thermoelectric element without any compaction force or pressure in excess of one atmosphere applied to precursor material and/or thermoelectric alloy in the mold. Embodiments differ from previously known processes which compact a powder before placement in a mold, perhaps by forming a green body, or which compact the powder in the mold before or during heating. The term compaction, as used herein, refers to a reduction in volume of the powder imposed by a force external to the powder, for example mechanical compression or compression by exposure to a gas pressure greater than one atmosphere.

The method continues at step 108 with heating the precursor material in the mold to a temperature that is less than a melting point temperature of the thermoelectric alloy to be formed from the precursor material by performance of the method embodiment. A thermoelectric alloy formed in accord with an embodiment has an accurately measurable melting point temperature, corresponding to a temperature at which the solid material of the thermoelectric element becomes a liquid. As shown in step 110, heating of the precursor material continues until the thermoelectric element is formed from the thermoelectric alloy. After the thermoelectric element forms, the element may be allowed to cool and may be removed from the mold. However, in some alternative embodiments, the thermoelectric element may be allowed to remain in the mold during its operational lifetime, perhaps to protect the thermoelectric element from mechanical stress, provide electrical or thermal insulation, or reduce manufacturing cost.

A thermoelectric element produced in accord with an embodiment may undergo substantial shrinkage in at least two mutually orthogonal spatial dimensions as the uncompressed powder condenses into a dense solid compared to the dimensions of the cavity used to form the element. In some embodiments, a shape of the mold cavity is accurately reproduced by the shape of the thermoelectric element, although at a smaller scale. The preferred thermal and electrical properties of a thermoelectric element produced by an embodiment may not be preserved if the thermoelectric alloy formed from the precursor material is permitted to liquefy while the thermoelectric element is being formed.

Table 1 lists a representative example of experimental results for formation of a cylindrically shaped densified object in which precursor materials were selected to produce a thermoelectric element. The cylindrically shaped densified object was formed by completely filling a cylindrically shaped cavity in a mold with loose, uncompacted, powdered solid precursor material. In the example shown in the table a loose powder was placed into a cavity in a mold. The powder had an overall ratio of components on an atomic basis of 2.2 parts magnesium, 0.382 parts silicon, 0.95 parts tin, and 0.014 parts antimony. As revealed by x-ray diffraction and electron dispersive spectroscopy, the powder is a mixture composed of component regions of pure magnesium, pure silicon, pure tin, and pure antimony, as well as component regions of alloys of magnesium, silicon, tin, and/or antimony. The filled mold was heated to 875 degrees Celsius and held for 20 minutes. The mold was then cooled to room temperature and the finished densified thermoelectric element was removed.

TABLE 1

|  | Diameter | Length |
| --- | --- | --- |
| Mold cavity (unit = inch) | 0.375 | 0.640 |
| Thermoelectric element (unit = inch) | 0.238 | 0.400 |
| reduction in linear dimension (unit = percent) | 36.5 | 37.5 |

In other, similar tests, linear dimensions in at least two mutually orthogonal spatial directions have been reduced by more than 40% when comparing dimensions of the densified solid object to corresponding dimensions of a mold cavity. The reduction in linear dimensions of the densified solid object is much greater than the 0.2-5% shrinkage contribution expected for thermal contraction of a solid upon cooling as characterized by a material's coefficient of thermal expansion.

The components of the precursor material may optionally be selected to cause a reduction of at least 40% in at least two mutually orthogonal linear dimensions of the densified solid object compared to corresponding linear dimensions of the mold cavity. The observed shrinkage occurs in the absence of any compression force originating outside the mold cavity and acting on the precursor material, for example by mechanical compaction from a tamping instrument or by pressure of a gas above the powder in a closed vessel.

In some embodiments, the precursor material is heated at normal atmospheric pressure. In some embodiments, the precursor material may be heated in an atmosphere containing a substantial fraction of argon, xenon, or hydrogen, singly or in combination. In some embodiments, the powder in the mold may be exposed to gas containing less than five parts per million of oxygen and less than ten parts per million of water.

Figure 2:
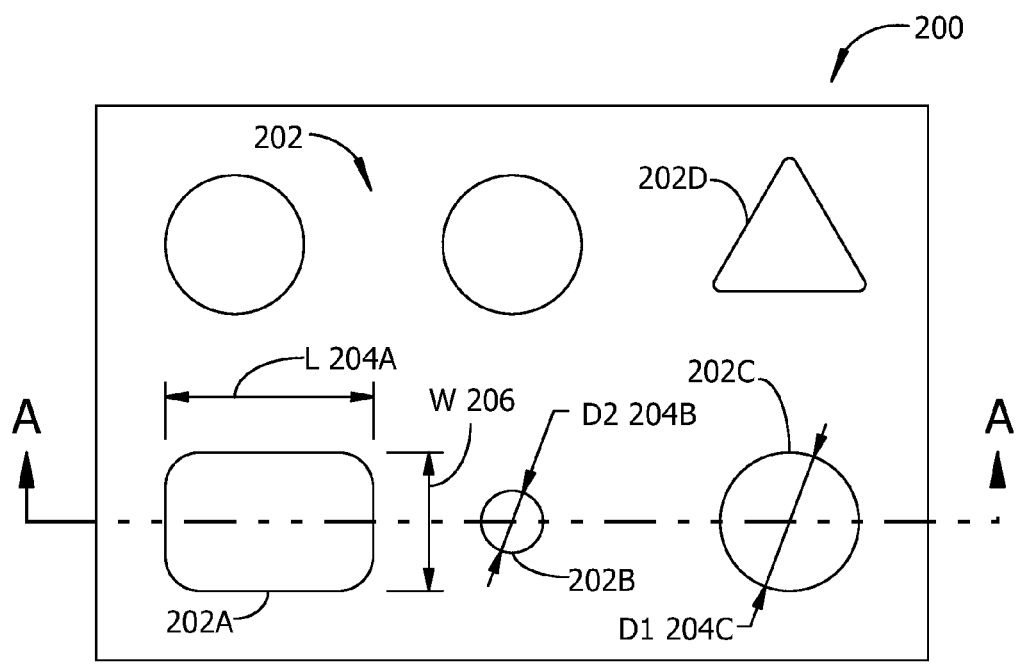
FIG. 2 shows examples of a mold and mold cavities with different shapes and linear dimensions in accord with an embodiment.
Figure 3:
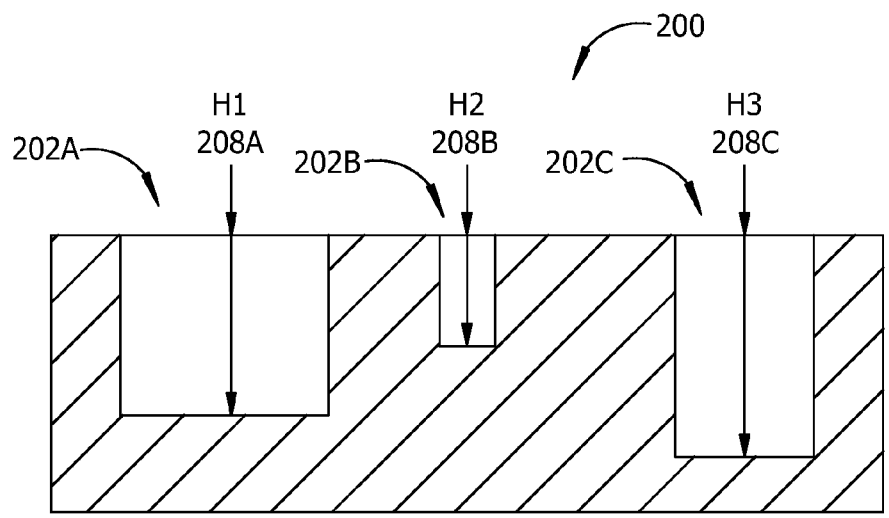
FIG. 3 shows a cross-section view A-A of the example of a mold from FIG. 2.
Figure 4:
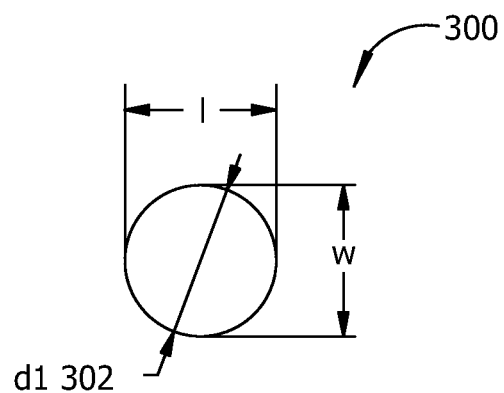
FIG. 4 shows a top view of an example of a densified solid object formed in a cavity from the mold of FIGS. 2-3 and subjected to the steps from the example of FIG. 1, marked with examples of linear dimensions for determining shrinkage in at least two mutually orthogonal spatial directions.

FIGS. 2-4 show examples of linear dimensions that may be used to determine percent reduction in at least two mutually orthogonal linear dimensions. FIG. 2 shows a view toward a top side of an example of a mold 200 formed with six mold cavities 202. Examples of linear dimensions are labeled for a rectangular cavity 202A having a length L 204A and a width W 206, a small cylindrical cavity 202B having a diameter D2 204B, and a large cylindrical cavity 202C having a diameter D1 204C. An approximately triangular cavity 202D or other regular or irregular shapes may be used to form a thermoelectric element. FIG. 3 shows examples of a linear dimensions corresponding to height (H1, 208A) for the rectangular cavity 202A, (H2, 208B) for the small cylindrical cavity 202B, and (H3, 208C) for the large cylindrical cavity 202C. A mold 200 in accord with an embodiment may have any convenient number, size, and shape of mold cavities.

Figure 5:
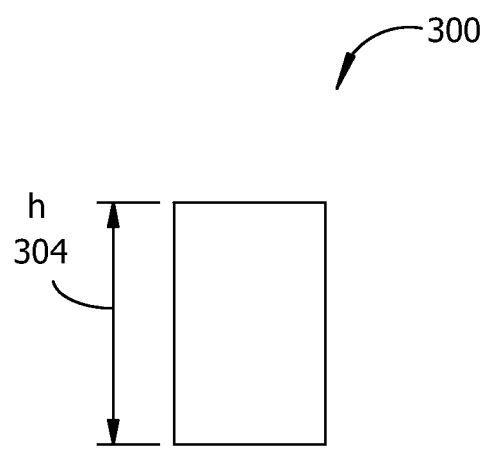
FIG. 5 shows a side view of the example of the solid object from FIG. 4.

Examples of linear dimensions for a densified solid object 300 produced in accord with an embodiment appear in FIG. 4 and FIG. 5. The cylindrical object 300 has a diameter d1 302 which may alternatively be described by mutually orthogonal linear dimensions length L and width w, and a height dimension h 304 orthogonal to the diameter d1. A value for a magnitude of shrinkage may be calculated by comparing dimensions for a mold to dimensions for a finished thermoelectric element, for example by calculating shrinkage from: shrinkage=(mold dimension−object dimension)/mold dimension.

Figure 6:
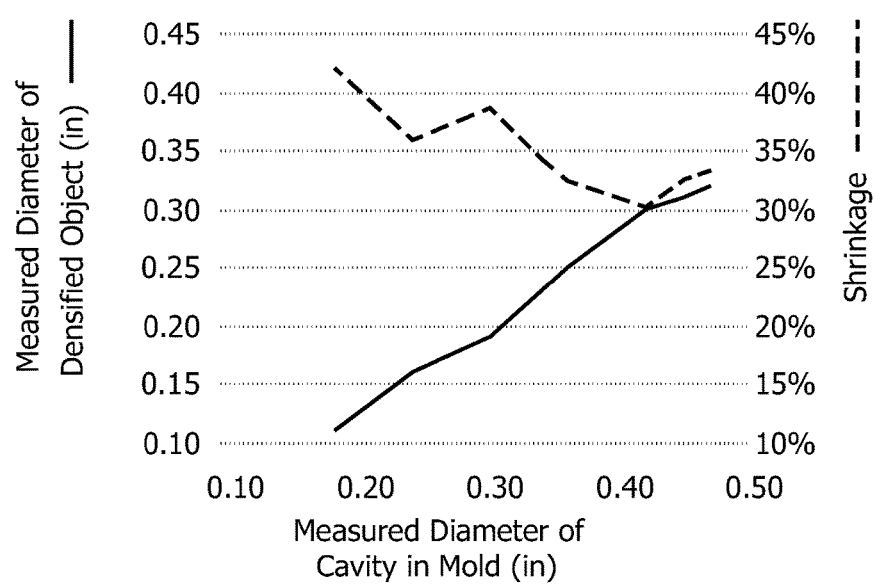
FIG. 6 is a plot of measured dimensions and calculated values of shrinkage for an approximately cylindrical thermoelectric element made in accord with an embodiment.

FIG. 6 shows examples of measurements on thermoelectric elements formed as approximately cylindrical test samples. The solid line graphs the measured diameter of the thermoelectric element (left vertical axis) for the corresponding diameter of the aperture in the mold (horizontal axis). The dashed line graphs a calculated value of shrinkage for the densified object compared to the corresponding mold dimensions. Note that all of the tested thermoelectric elements have shrinkage in excess of 30% in at least two mutually orthogonal spatial directions, with some exceeding 40% shrinkage.

Figure 7:
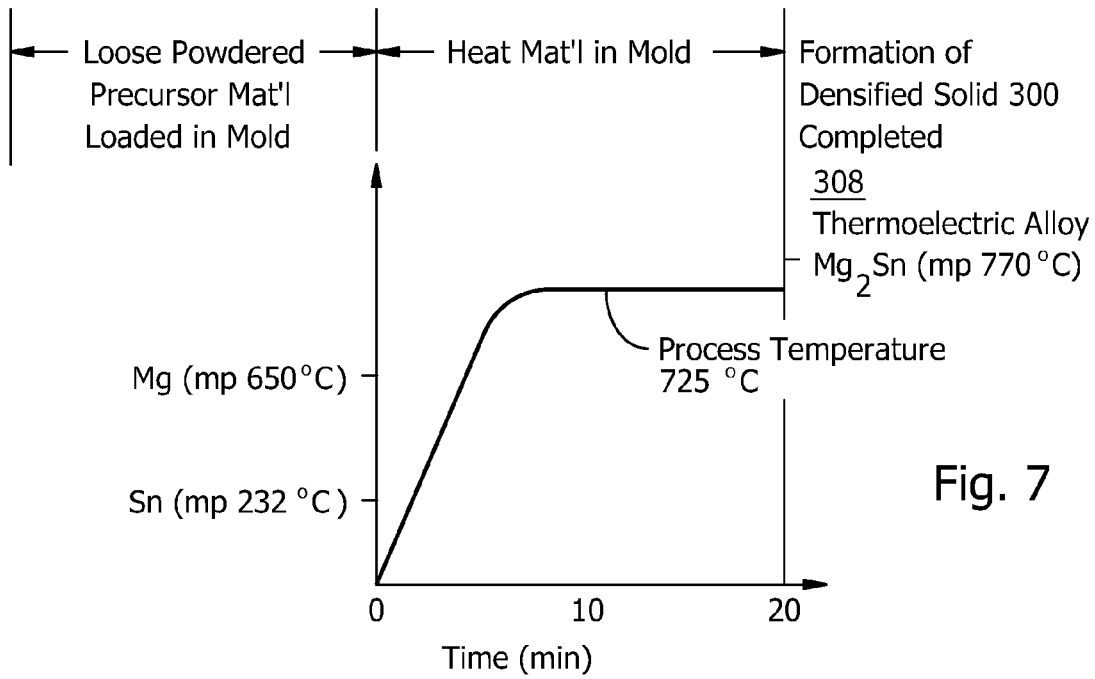
FIG. 7 shows an example of a process temperature used to form a densified solid thermoelectric element from a thermoelectric alloy resulting from heating of uncompacted powdered solid precursor materials in a mold.
Figure 8:
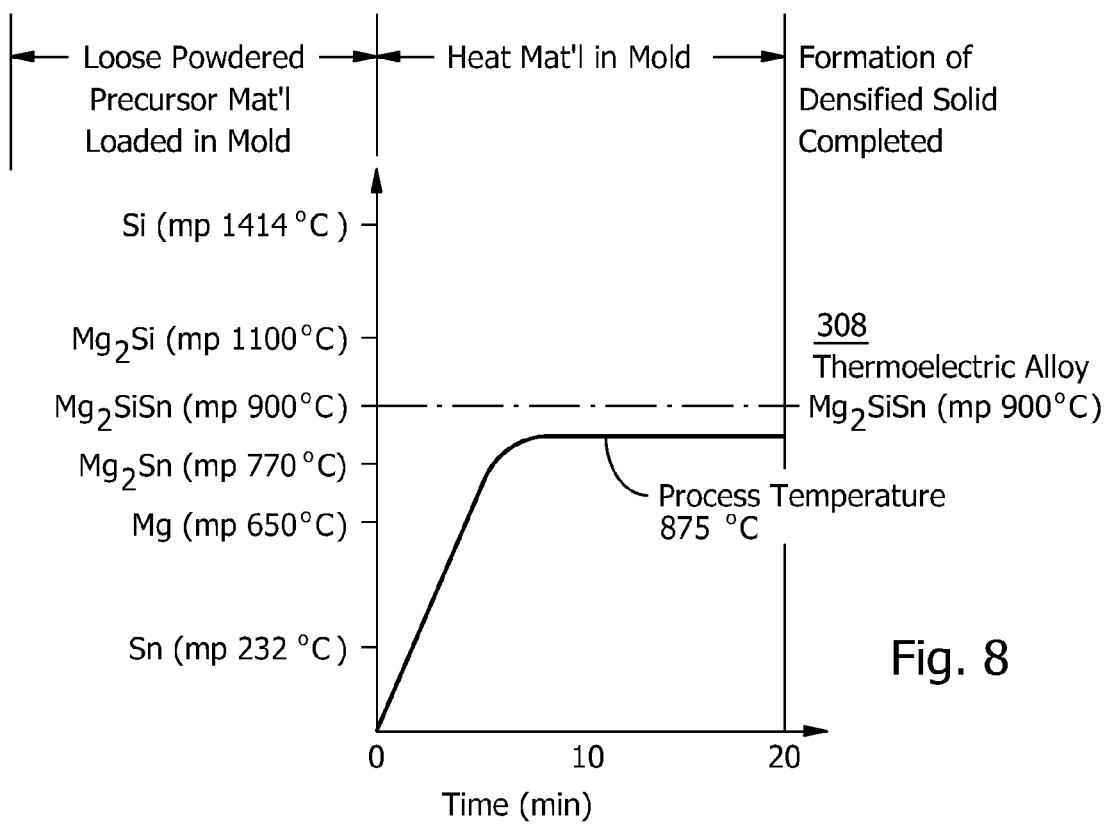
FIG. 8 shows another example of a process temperature used to form a thermoelectric element from a different set of powdered precursor materials compared to FIG. 7.

FIGS. 7-8 show examples of process temperatures for heating precursor materials to form thermoelectric elements. In FIG. 7, magnesium and tin are heated to a temperature of 725° C. in an oven. In less than twenty minutes, a densified solid object forms having a melting point temperature of 770° C. The densified solid object corresponds to a thermoelectric element comprising a preferred thermoelectric alloy $Mg_2Sn$. FIG. 8 shows a graph of temperature for a precursor material formed by milling tin, magnesium, and silicon. These elemental constituents of the loose powdered precursor material may begin reacting with one another during the milling process to form the intermediates shown, some of which may develop further during heating. The heating process preferably continues until the predominant component of the resulting densified solid is a thermoelectric alloy $Mg_2SiSn$. As indicated in the examples of FIGS. 7 and 8, the process temperature used for heating the precursor material is preferably less than the melting point temperature of the preferred thermoelectric alloy 308.

A mold 200 may be formed from a material that is relatively chemically inert with respect to the powdered solid precursor material, strong, and dimensionally stable at temperatures expected during formation of thermoelectric elements made in the mold. For example, the material of the mold may be selected from materials including any one or more of graphite, boron nitride, alumina, glass such as borosilicate glass or quartz. The mold may alternatively include a metal component, for example, but not limited to, stainless steel, steel, and copper, and may optionally be coated with chemically inert materials such as graphite, boron nitride, or alumina.

The powdered solid precursor material will preferably be selected to form a thermoelectric alloy. For example, the precursor material may be selected to include at least one of a form of bismuth, tellurium, selenium, antimony, zinc, magnesium, tin, lead, silver, gallium, iron, cobalt, silicon, germanium, iodine, manganese, aluminum, indium, barium, cobalt, and nickel, either singly or in combination, and preferably in powder or granular form. The thermoelectric precursor may alternatively be selected from compounds that include the aforementioned elements. The precursor material may optimally comprise a mixture of elements and compounds.

In a preferred embodiment for forming a thermoelectric element from a thermoelectric alloy, the precursor material is selected to include at least one of a form of magnesium, a form of silicon, and a form of tin. An embodiment may optionally include combining the powdered solid precursor material with at least one of a form of lithium, a form of aluminum, a form of gallium, and a form of indium. Alternatively, an embodiment may include combining the powdered solid precursor material with at least one of a form of antimony and a form of bismuth. An embodiment may optionally include combining any one or more of magnesium, tin, antimony, and possibly bismuth, singly or in combination, to yield an N-type thermoelectric element, or minor components of lithium, aluminum, gallium, and/or to ultimately yield a P-type thermoelectric element.

Powdered solid precursor materials for forming thermoelectric elements may be prepared using ball milling from elemental powders, although precursor powders suitable for use with an embodiment may be prepared by other means. Raw materials introduced initially into the ball mill may include magnesium turnings of at least 99.98% purity, tin powder of at least 99.85% purity, silicon powder of at least 99.9% purity, and antimony powder of at least 99.5% purity. The powder produced by the mill exhibits a density compared with an ideal theoretical density of the final desired compound of less than 30%. Raw materials may be milled for a time exceeding 15 hours to a powder size of −100 mesh. The resulting powder is composed of components of antimony doped $Mg_2Si$, antimony doped $Mg_2Sn$, disordered mixed phases of Mg, Si, Sn, and Sb, as well as regions of pure Mg, Si, Sb, and Sn.

In another example of an embodiment, due to the sensitivity of the prepared powder, the environment surrounding a powder in a mold during heating preferably includes less than 5 ppm oxygen and less than 5 ppm nitrogen with a balance of principally argon. After milling, the powdered precursor material is loaded without compaction of into a graphite mold. The powdered solid precursor material may then be heated at a rate of 30° C. per minute to a set point temperature for processing of 875° C., and held at the processing temperature for 15 minutes. At the end of the planned time duration of 15 minutes, the set point temperature is reduced and the samples, now operable as thermoelectric elements in a thermoelectric module, are removed from the mold. The thermoelectric elements produced in this example exhibit a density with respect to an ideal theoretical density for the thermoelectric alloy in a range from 70% to 100%.

Figure 9:
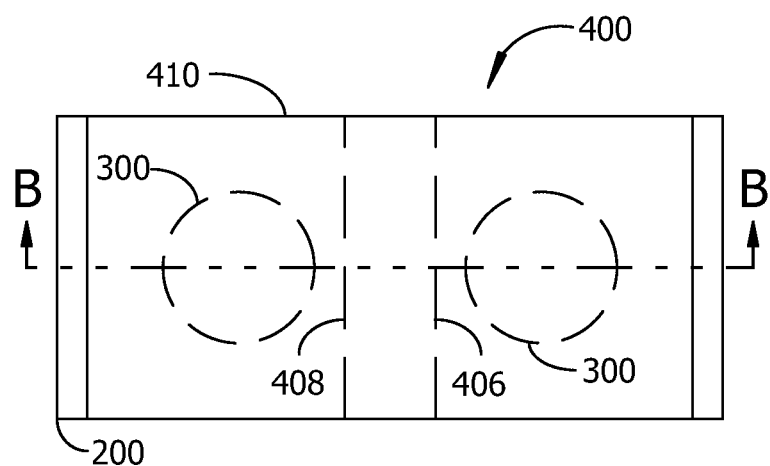
FIG. 9 shows a top view of an example of a thermoelectric module formed in accord with an embodiment.
Figure 10:
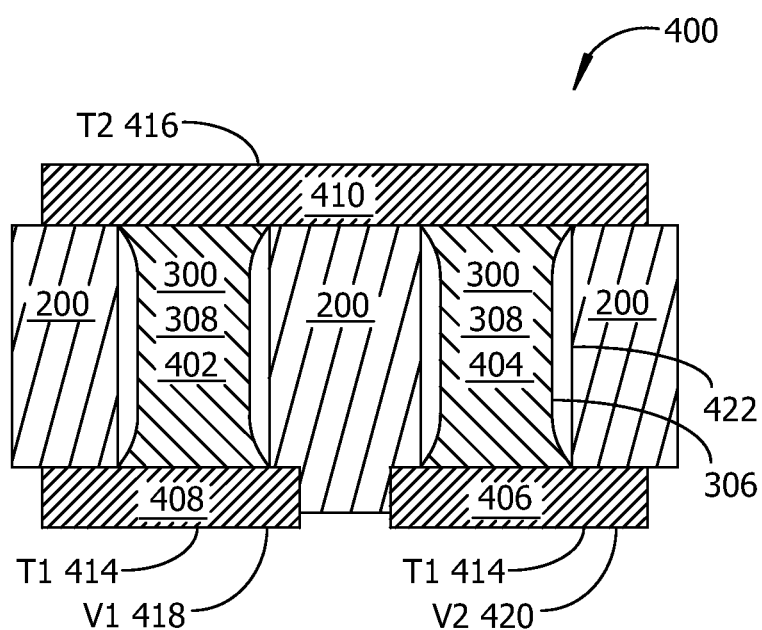
FIG. 10 shows a cross-section view B-B of the example of a thermoelectric module from FIG. 9.

An embodiment may optionally include forming a thermoelectric module by bonding at least two thermoelectric elements to an electrically conductive connecting plate, as shown in the examples of FIGS. 9-10. The connecting plate may be formed from a metal with a thermal coefficient of thermal expansion similar to the thermal expansion of the final thermoelectric elements to be formed. When the precursor material includes any one or more of magnesium, silicon, or tin as major components, a preferred material for the connecting plate is selected to include any one or more of titanium, 17-4 stainless steel, and 400 series stainless steel alloys. In alternative embodiments, the connecting plate may be selected from materials including nickel and 300 series stainless steel alloys.

As suggested in FIGS. 9-10, an embodiment may optionally include bonding a first thermoelectric element, possibly a P-type element 402, to a first electrically conductive connecting plate 408, a second thermoelectric element, possibly an N-type element 404, to a second electrically conductive connecting plate 410, and a third electrically conductive connecting plate 406 to both of the first and second thermoelectric elements. After the thermoelectric module is completed and ready for use, exposing the connecting plates to a first temperature T1 414 and a second temperature T2 416 develops a temperature gradient across the thermoelectric module 400, inducing a voltage differential comprising a first voltage V1 418 and a second voltage V2 420 across the first and second conductive plates. Alternatively, imposing a voltage differential [V2-V1] across the first and second conductive plates induces a temperature difference [T2-T1] across the thermoelectric elements (402, 404).

A thermoelectric module may optionally be formed with the mold used to make the thermoelectric elements providing a fixture for attachment of the connecting plates. In the example of FIG. 10, the P-type thermoelectric element 402 and the N-type thermoelectric element 404 may form a strong bond to the connecting plates (406, 408, 410). As a surface 306 of the densified solid object 300 shrinks away from a cavity wall 422, the P-type and N-type thermoelectric elements remain connected to the connecting plates. The mold 200 may optionally be removed from the thermoelectric module, or may alternatively be left in place in the finished module.

Unless expressly stated otherwise herein, ordinary terms have their corresponding ordinary meanings within the respective contexts of their presentations, and ordinary terms of art have their corresponding regular meanings.

What is claimed is:

1. A method, comprising:
    (a) selecting an uncompacted powdered solid precursor material, wherein said uncompacted powdered solid precursor material comprises two different elements;
    (b) introducing said uncompacted powdered solid precursor material into a cavity in a mold;
    (c) heating said uncompacted powdered solid precursor material to a temperature that is (i) greater than a melting point temperature of said two different elements and (ii) less than a melting point temperature of a thermoelectric alloy comprising said two different elements; and
    (d) heating said uncompacted powdered solid precursor material at said temperature in said mold until said uncompacted powdered solid precursor material forms said thermoelectric element comprising said thermoelectric alloy, wherein said thermoelectric element is for generating electrical power,
    wherein said uncompacted powdered solid precursor material is selected to cause a reduction, during (c) and (d), for at least two mutually orthogonal linear dimensions of said thermoelectric element compared to corresponding linear dimensions of said cavity in said mold, and wherein (b)-(d) are performed without any compaction force or pressure in excess of one atmosphere.

2. The method of claim 1, wherein said reduction is at least twenty percent (20%).

3. The method of claim 1, wherein said reduction is at least thirty percent (30%).

4. The method of claim 1, wherein said reduction is at least forty percent (40%).

5. The method of claim 1, further comprising selecting said uncompacted powdered solid precursor material to include at least one of a form of bismuth, tellurium, selenium, antimony, zinc, magnesium, tin, lead, silver, gallium, iron, cobalt, silicon, germanium, iodine, manganese, aluminum, indium, barium, cobalt, and nickel.

6. The method of claim 5, further comprising combining said uncompacted powdered solid precursor material with at least one of a form of magnesium and a form of silicon.

7. The method of claim 5, further comprising combining said uncompacted powdered solid precursor material with at least one of a form of lithium, a form of aluminum, a form of gallium, and a form of indium.

8. The method of claim 5, further comprising combining said uncompacted powdered solid precursor material with at least one of a form of antimony and a form of bismuth.

9. The method of claim 1, further comprising selecting said uncompacted powdered solid precursor material to form an N-type thermoelectric material.

10. The method of claim 1, further comprising selecting said uncompacted powdered solid precursor material to form a P-type thermoelectric material.

11. The method of claim 1, further comprising reducing a number of nitrogen molecules per unit volume available for coming into contact with said uncompacted powdered solid precursor material during heating.

12. The method of claim 1, further comprising reducing a number of oxygen molecules per unit volume available for coming into contact with said uncompacted powdered solid precursor material during heating.

13. The method of claim 1, further comprising simultaneously forming more than one thermoelectric element in a same mold.

14. The method of claim 1, further comprising heating said uncompacted powdered solid precursor material in the presence of gaseous hydrogen.

15. The method of claim 1, further comprising heating said uncompacted powdered solid precursor material in the presence of at least one of argon and xenon.

16. The method of claim 1, further comprising forming a thermoelectric module by bonding two of said thermoelectric element to an electrically conductive connecting plate.

17. The method of claim 16, further comprising bonding a first thermoelectric element to a first electrically conductive connecting plate, a second thermoelectric element to a second electrically conductive connecting plate, and a third electrically conductive connecting plate to both of said first and second thermoelectric elements.

18. The method of claim 1, wherein said uncompacted powdered solid precursor material further comprises an additional element that is different than said two different elements, and wherein in (c), said temperature is less than a melting point of said additional element and less than a melting point temperature of said thermoelectric alloy, which thermoelectric alloy comprises said two different elements and said additional element.

* * * * *